US011646335B2

(12) United States Patent
McGarvey

(10) Patent No.: US 11,646,335 B2
(45) Date of Patent: May 9, 2023

(54) SEMICONDUCTOR DEVICES WITH SINGLE-PHOTON AVALANCHE DIODES AND RECTANGULAR MICROLENSES

(71) Applicant: SEMICONDUCTOR COMPONENTS INDUSTRIES, LLC, Phoenix, AZ (US)

(72) Inventor: Brian Patrick McGarvey, Templemartin (IE)

(73) Assignee: SEMICONDUCTOR COMPONENTS INDUSTRIES, LLC, Scottsdale, AZ (US)

(*) Notice: Subject to any disclaimer, the term of this patent is extended or adjusted under 35 U.S.C. 154(b) by 237 days.

(21) Appl. No.: 16/776,815

(22) Filed: Jan. 30, 2020

(65) Prior Publication Data
US 2021/0242261 A1    Aug. 5, 2021

(51) Int. Cl.
| | |
|---|---|
| H01L 27/146 | (2006.01) |
| H01L 31/107 | (2006.01) |
| G01S 7/481 | (2006.01) |
| H04N 25/75 | (2023.01) |
| G01S 7/4863 | (2020.01) |
| G01S 7/4914 | (2020.01) |
| H01L 31/0232 | (2014.01) |

(Continued)

(52) U.S. Cl.
CPC ...... *H01L 27/14627* (2013.01); *G01S 7/4816* (2013.01); *H01L 27/14609* (2013.01);
(Continued)

(58) Field of Classification Search
CPC ......... H01L 27/14627; H01L 27/14609; H01L 31/107; H01L 31/02327; H01L 31/02027;
(Continued)

(56) References Cited

U.S. PATENT DOCUMENTS

| | | | | |
|---|---|---|---|---|
| 2006/0192086 A1* | 8/2006 | Niclass | ................. | H01L 31/107 257/E31.063 |
| 2011/0266420 A1* | 11/2011 | Eldesouki | ......... | H01L 31/02019 250/214.1 |

(Continued)

FOREIGN PATENT DOCUMENTS

| | | | | |
|---|---|---|---|---|
| CN | 104576667 A | * | 4/2015 | ....... H01L 27/14603 |
| DE | 102015102631 A1 | | 8/2016 | |

(Continued)

OTHER PUBLICATIONS

Rasshofer et al. "Automotive Radar and Lidar Systems for Next Generation Driver Assistance Functions." Advances in Radio Science, 3, 205-209, 2005.

(Continued)

*Primary Examiner* — Ermias T Woldegeorgis
(74) *Attorney, Agent, or Firm* — Treyz Law Group, P.C.; Joseph F. Guihan

(57) ABSTRACT

An imaging device may include single-photon avalanche diodes (SPADs). The single-photon avalanche diodes may be arranged in an array of microcells (such as a silicon photomultiplier). Each microcell may have an aspect ratio that is greater than 1. Each microcell may be covered by a microlens that also has an aspect ratio that is greater than 1. The microlens may have curvature in a first direction (parallel to the width of the microcell/microlens) and less curvature in a second direction that is orthogonal to the first direction (parallel to the length of the microcell/microlens). Forming non-square, rectangular microcells and microlenses in this fashion may allow for larger microcells that still have satisfactory microlens performance.

10 Claims, 9 Drawing Sheets

(51) Int. Cl.
  *G01S 17/894* (2020.01)
  *H01L 31/02* (2006.01)
(52) U.S. Cl.
  CPC .......... *H01L 31/107* (2013.01); *G01S 7/4863* (2013.01); *G01S 7/4914* (2013.01); *G01S 17/894* (2020.01); *H01L 27/14643* (2013.01); *H01L 31/02027* (2013.01); *H01L 31/02327* (2013.01); *H04N 25/75* (2023.01)
(58) Field of Classification Search
  CPC ............. H01L 27/14643; G01S 7/4816; G01S 7/4863; G01S 7/4914; G01S 17/894
  See application file for complete search history.

(56) References Cited

U.S. PATENT DOCUMENTS

| | | |
|---|---|---|
| 2013/0015331 A1 | 1/2013 | Birk et al. |
| 2013/0153975 A1 | 6/2013 | Henseler et al. |
| 2013/0313414 A1 | 11/2013 | Pavlov et al. |
| 2016/0269662 A1* | 9/2016 | Hepper .............. H01L 27/14621 |
| 2017/0366769 A1* | 12/2017 | Mlinar .............. H01L 27/14627 |
| 2018/0329035 A1* | 11/2018 | Pacala .................. H04B 10/503 |
| 2021/0183930 A1* | 6/2021 | Takatsuka ......... H01L 27/14627 |

FOREIGN PATENT DOCUMENTS

| | | | | |
|---|---|---|---|---|
| EP | 2144303 A1 | * | 1/2010 | ........... H01L 31/107 |
| JP | 2007053318 A | * | 3/2007 | ........... G02B 3/0018 |
| WO | WO-2019131122 A1 | * | 7/2019 | ....... H01L 27/14605 |

OTHER PUBLICATIONS

Pavia et al. "Measurement and modeling of microlenses fabricated on single-photon avalanche diode arrays for fill factor recovery." Optics express; 2014.

* cited by examiner

SEMICONDUCTOR DEVICES WITH SINGLE-PHOTON AVALANCHE DIODES AND RECTANGULAR MICROLENSES

BACKGROUND

This relates generally to imaging systems and, more particularly, to imaging systems that include single-photon avalanche diodes (SPADs) for single photon detection.

Modern electronic devices such as cellular telephones, cameras, and computers often use digital image sensors. Image sensors (sometimes referred to as imagers) may be formed from a two-dimensional array of image sensing pixels. Each pixel typically includes a photosensitive element (such as a photodiode) that receives incident photons (light) and converts the photons into electrical signals.

Conventional image sensors may suffer from limited functionality in a variety of ways. For example, some conventional image sensors may not be able to determine the distance from the image sensor to the objects that are being imaged. Conventional image sensors may also have lower than desired image quality and resolution.

To improve sensitivity to incident light, single-photon avalanche diodes (SPADs) may sometimes be used in imaging systems. Single-photon avalanche diodes may be capable of single-photon detection.

It is within this context that the embodiments described herein arise.

DETAILED DESCRIPTION

Embodiments of the present invention relate to imaging systems that include single-photon avalanche diodes (SPADs).

Some imaging systems include image sensors that sense light by converting impinging photons into electrons or holes that are integrated (collected) in pixel photodiodes within the sensor array. After completion of an integration cycle, collected charge is converted into a voltage, which is supplied to the output terminals of the sensor. In complementary metal-oxide semiconductor (CMOS) image sensors, the charge to voltage conversion is accomplished directly in the pixels themselves, and the analog pixel voltage is transferred to the output terminals through various pixel addressing and scanning schemes. The analog pixel voltage can also be later converted on-chip to a digital equivalent and processed in various ways in the digital domain.

In single-photon avalanche diode (SPAD) devices, on the other hand, the photon detection principle is different. The light sensing diode is biased above its breakdown point, and when an incident photon generates an electron or hole, this carrier initiates an avalanche breakdown with additional carriers being generated. The avalanche multiplication may produce a current signal that can be easily detected by readout circuitry associated with the SPAD. The avalanche process can be stopped (or quenched) by lowering the diode bias below its breakdown point. Each SPAD may therefore include a passive and/or active quenching circuit for halting the avalanche.

This concept can be used in two ways. First, the arriving photons may simply be counted (e.g., in low light level applications). Second, the SPAD pixels may be used to measure photon time-of-flight (ToF) from a synchronized light source to a scene object point and back to the sensor, which can be used to obtain a 3-dimensional image of the scene.

Figure 1:
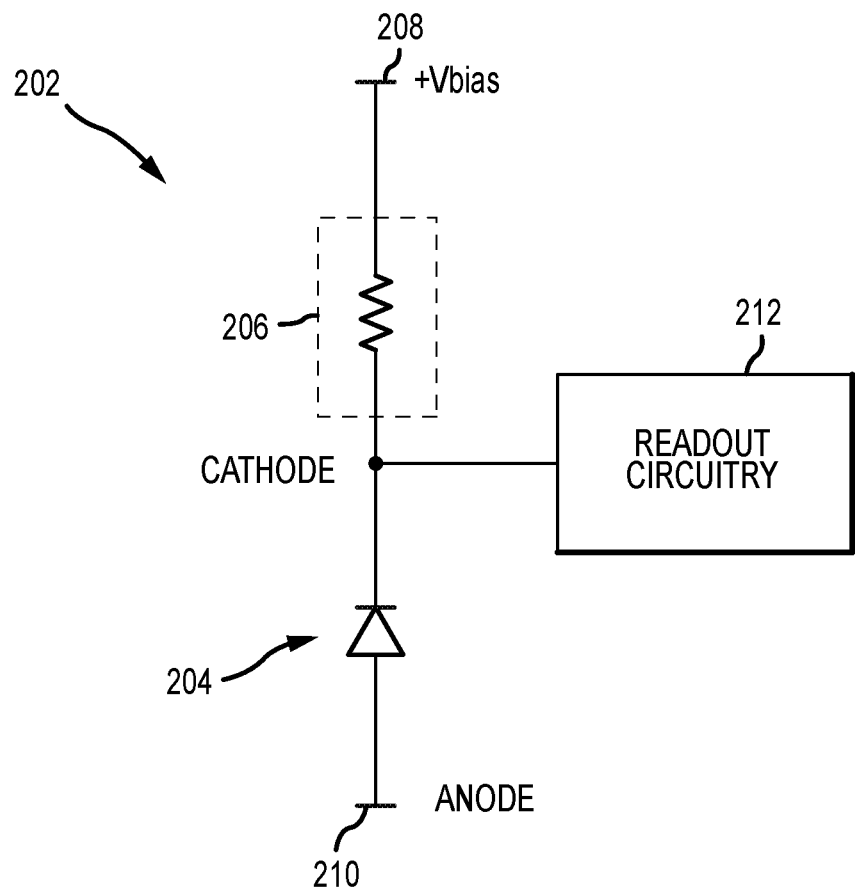
FIG. 1 is a circuit diagram showing an illustrative single-photon avalanche diode pixel in accordance with an embodiment.

FIG. 1 is a circuit diagram of an illustrative SPAD device 202. As shown in FIG. 1, SPAD device 202 includes a SPAD 204 that is coupled in series with quenching circuitry 206 between a first supply voltage terminal 210 (e.g., a ground power supply voltage terminal) and a second supply voltage terminal 208 (e.g., a positive power supply voltage terminal). In particular, SPAD device 202 includes a SPAD 204 having an anode terminal connected to power supply voltage terminal 210 and a cathode terminal connected directly to quenching circuitry 206. SPAD device 202 that includes SPAD 204 connected in series with a quenching resistor 206 is sometimes referred to collectively as a photo-triggered unit or "microcell." During operation of SPAD device 202, supply voltage terminals 208 and 210 may be used to bias SPAD 204 to a voltage that is higher than the breakdown voltage (e.g., bias voltage Vbias is applied to terminal 208). Breakdown voltage is the largest reverse voltage that can be applied to SPAD 204 without causing an exponential increase in the leakage current in the diode. When SPAD 204 is reverse biased above the breakdown voltage in this manner, absorption of a single-photon can trigger a short-duration but relatively large avalanche current through impact ionization.

Quenching circuitry 206 (sometimes referred to as quenching element 206) may be used to lower the bias voltage of SPAD 204 below the level of the breakdown voltage. Lowering the bias voltage of SPAD 204 below the breakdown voltage stops the avalanche process and corresponding avalanche current. There are numerous ways to form quenching circuitry 206. Quenching circuitry 206 may be passive quenching circuitry or active quenching circuitry. Passive quenching circuitry may, without external control or monitoring, automatically quench the avalanche current once initiated. For example, FIG. 1 shows an example where a resistor component is used to form quenching circuitry 206. This is an example of passive quenching circuitry.

This example of passive quenching circuitry is merely illustrative. Active quenching circuitry may also be used in SPAD device 202. Active quenching circuitry may reduce the time it takes for SPAD device 202 to be reset. This may allow SPAD device 202 to detect incident light at a faster rate than when passive quenching circuitry is used, improving the dynamic range of the SPAD device. Active quenching circuitry may modulate the SPAD quench resistance. For example, before a photon is detected, quench resistance is set high and then once a photon is detected and the avalanche is quenched, quench resistance is minimized to reduce recovery time.

SPAD device 202 may also include readout circuitry 212. There are numerous ways to form readout circuitry 212 to obtain information from SPAD device 202. Readout circuitry 212 may include a pulse counting circuit that counts arriving photons. Alternatively or in addition, readout circuitry 212 may include time-of-flight circuitry that is used to measure photon time-of-flight (ToF). The photon time-of-flight information may be used to perform depth sensing. In one example, photons may be counted by an analog counter to form the light intensity signal as a corresponding pixel voltage. The ToF signal may be obtained by also converting the time of photon flight to a voltage. The example of an analog pulse counting circuit being included in readout circuitry 212 is merely illustrative. If desired, readout circuitry 212 may include digital pulse counting circuits. Readout circuitry 212 may also include amplification circuitry if desired.

The example in FIG. 1 of readout circuitry 212 being coupled to a node between diode 204 and quenching circuitry 206 is merely illustrative. Readout circuitry 212 may be coupled to terminal 208 or any desired portion of the SPAD device. In some cases, quenching circuitry 206 may be considered integral with readout circuitry 212.

Because SPAD devices can detect a single incident photon, the SPAD devices are effective at imaging scenes with low light levels. Each SPAD may detect the number of photons that are received within a given period of time (e.g., using readout circuitry that includes a counting circuit). However, as discussed above, each time a photon is received and an avalanche current initiated, the SPAD device must be quenched and reset before being ready to detect another photon. As incident light levels increase, the reset time becomes limiting to the dynamic range of the SPAD device (e.g., once incident light levels exceed a given level, the SPAD device is triggered immediately upon being reset).

Figure 2:
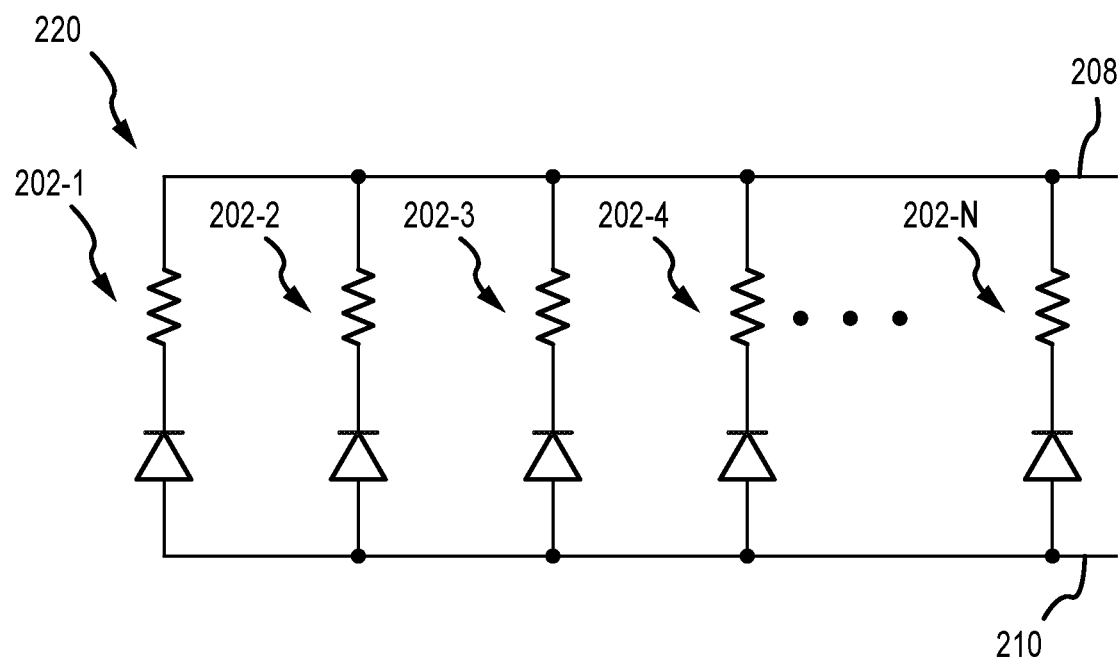
FIG. 2 is a diagram of an illustrative silicon photomultiplier in accordance with an embodiment.

Multiple SPAD devices may be grouped together to help increase dynamic range. FIG. 2 is a circuit diagram of an illustrative group 220 of SPAD devices 202. The group or array of SPAD devices may sometimes be referred to as a silicon photomultiplier (SiPM). As shown in FIG. 2, silicon photomultiplier 220 may include multiple SPAD devices that are coupled in parallel between first supply voltage terminal 208 and second supply voltage terminal 210. FIG. 2 shows N SPAD devices 202 coupled in parallel (e.g., SPAD device 202-1, SPAD device 202-2, SPAD device 202-3, SPAD device 202-4, . . . , SPAD device 202-N). More than two SPAD devices, more than ten SPAD devices, more than one hundred SPAD devices, more than one thousand SPAD devices, etc. may be included in a given silicon photomultiplier 220.

Each SPAD device 202 may sometimes be referred to herein as a SPAD pixel 202. Although not shown explicitly in FIG. 2, readout circuitry for the silicon photomultiplier 220 may measure the combined output current from all of SPAD pixels in the silicon photomultiplier. Configured in this way, the dynamic range of an imaging system including the SPAD pixels may be increased. Each SPAD pixel is not guaranteed to have an avalanche current triggered when an incident photon is received. The SPAD pixels may have an associated probability of an avalanche current being triggered when an incident photon is received. There is a first probability of an electron being created when a photon reaches the diode and then a second probability of the electron triggering an avalanche current. The total probability of a photon triggering an avalanche current may be referred to as the SPAD's photon-detection efficiency (PDE). Grouping multiple SPAD pixels together in the silicon photomultiplier therefore allows for a more accurate measurement of the incoming incident light. For example, if a single SPAD pixel has a PDE of 50% and receives one photon during a time period, there is a 50% chance the photon will not be detected. With the silicon photomultiplier 220 of FIG. 2, chances are that two of the four SPAD pixels will detect the photon, thus improving the provided image data for the time period.

The example of FIG. 2 in which the plurality of SPAD pixels 202 share a common output in silicon photomultiplier 220 is merely illustrative. In the case of an imaging system including a silicon photomultiplier having a common output for all of the SPAD pixels, the imaging system may not have any resolution in imaging a scene (e.g., the silicon photomultiplier can just detect photon flux at a single point). It may be desirable to use SPAD pixels to obtain image data across an array to allow a higher resolution reproduction of the imaged scene. In cases such as these, SPAD pixels in a single imaging system may have per-pixel readout capabilities. Alternatively, an array of silicon photomultipliers (each including more than one SPAD pixel) may be included in the imaging system. The outputs from each pixel or from each silicon photomultiplier may be used to generate image data for an imaged scene. The array may be capable of independent detection (whether using a single SPAD pixel or a plurality of SPAD pixels in a silicon photomultiplier) in a line array (e.g., an array having a single row and multiple columns or a single column and multiple rows) or an array having more than ten, more than one hundred, or more than one thousand rows and/or columns.

While there are a number of possible use cases for SPAD pixels as discussed above, the underlying technology used to detect incident light is the same. All of the aforementioned examples of devices that use SPAD pixels may collectively be referred to as SPAD-based semiconductor devices. A silicon photomultiplier with a plurality of SPAD pixels having a common output may be referred to as a SPAD-based semiconductor device. An array of SPAD pixels with per-pixel readout capabilities may be referred to as a SPAD-based semiconductor device. An array of silicon photomultipliers with per-silicon-photomultiplier readout capabilities may be referred to as a SPAD-based semiconductor device.

Figure 3:
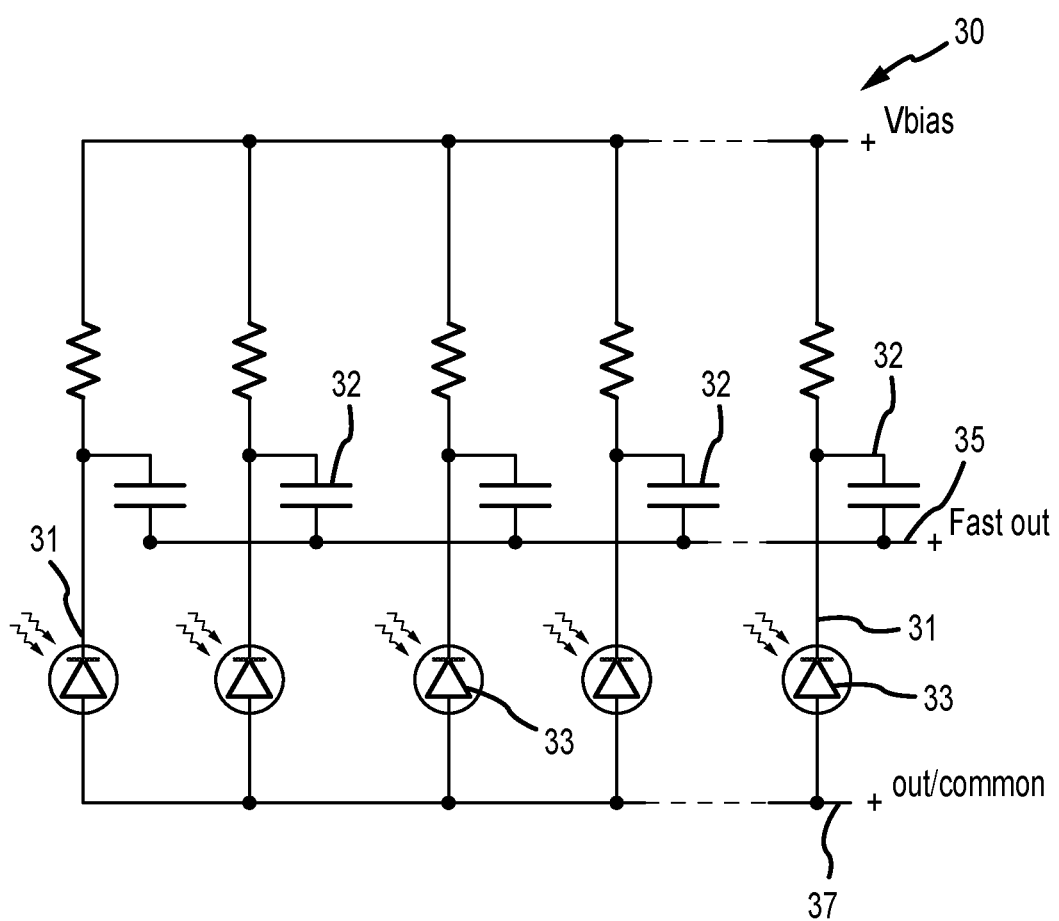
FIG. 3 is a schematic diagram of an illustrative silicon photomultiplier with a fast output terminal in accordance with an embodiment.

FIG. 3 illustrates a silicon photomultiplier 30. As shown in FIG. 3, SiPM 30 has a third terminal 35 which is capacitively coupled to each cathode terminal 31 in order to provide a fast readout of the avalanche signals from the SPADs 33. When then SPADs 33 emits a current pulse, part of the resulting change in voltage at the cathode 31 will be coupled via the mutual capacitance into the third ("fast") output terminal 35. Using the third terminal 35 for readout avoids the compromised transient performance resulting from the relatively large RC time constant associated with the biasing circuit that biases the top terminal of the quenching resistor.

Figure 4:
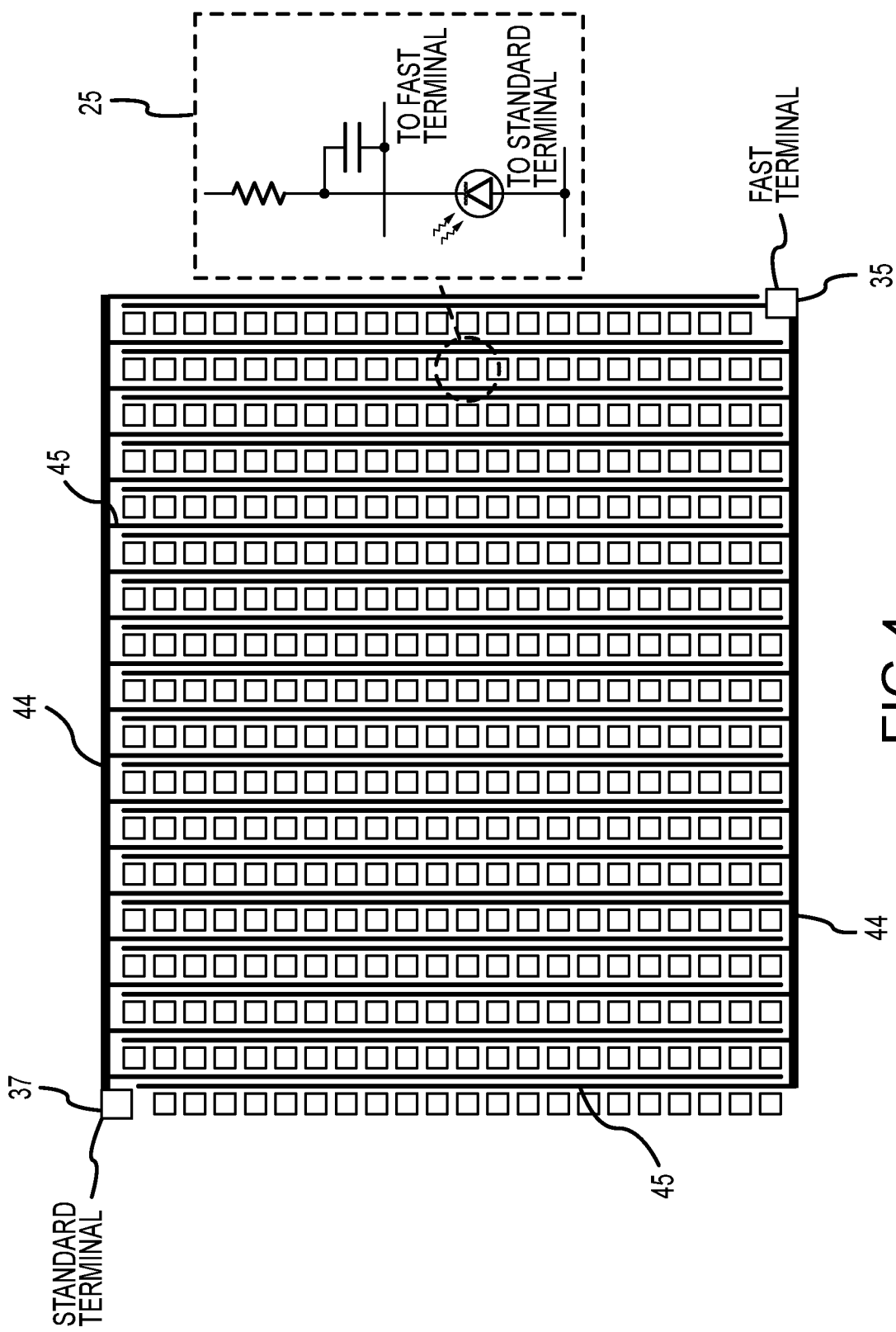
FIG. 4 is a diagram of an illustrative silicon photomultiplier comprising an array of microcells.

It will be appreciated by those skilled in the art that silicon photomultipliers include major bus lines 44 and minor bus lines 45 as illustrated in FIG. 4. The minor bus liens 45 may connect directly to each individual microcell 25. The minor bus lines 45 are then coupled to the major bus lines 44 which connect to the bond pads associated with terminals 37 and 35. Typically, the minor bus lines 45 extend vertically between the columns of microcells 25, whereas the major bus lines 44 extend horizontally adjacent the outer row of the microcells 25.

Figure 5:
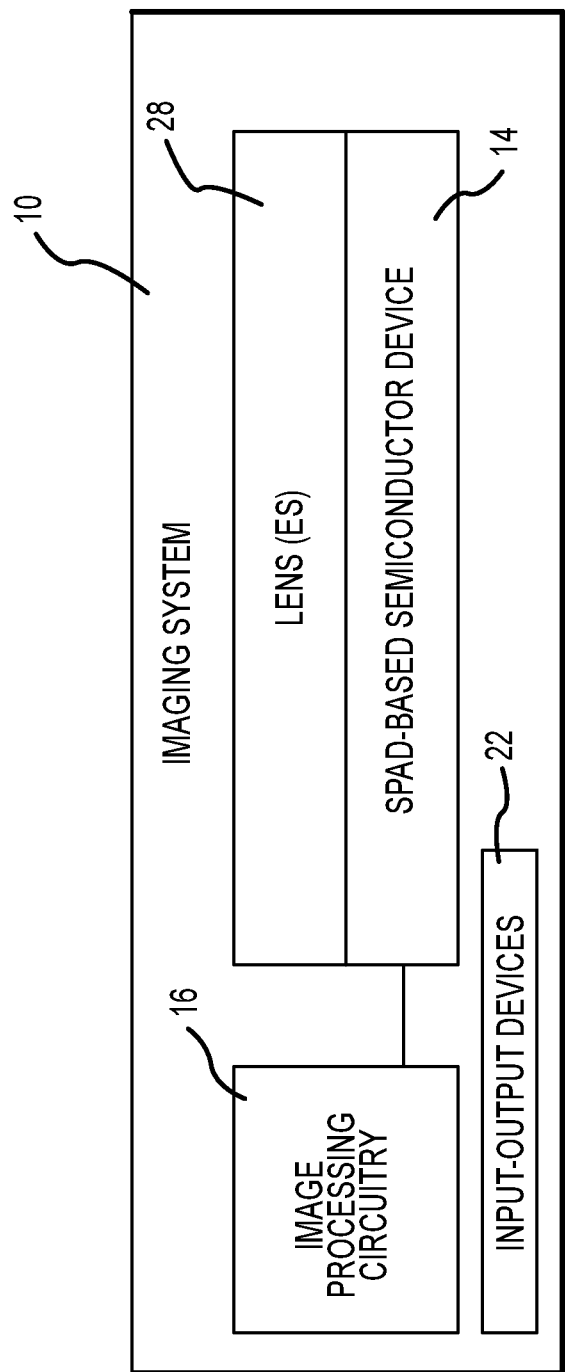
FIG. 5 is a schematic diagram of an illustrative imaging system that includes a SPAD-based semiconductor device in accordance with an embodiment.

An imaging system 10 with a SPAD-based semiconductor device is shown in FIG. 5. Imaging system 10 may be an electronic device such as a digital camera, a computer, a cellular telephone, a medical device, or other electronic device. Imaging system 10 may be an imaging system on a vehicle (sometimes referred to as vehicular imaging system). Imaging system may be used for LIDAR applications.

Imaging system 14 may include one or more SPAD-based semiconductor devices 14 (sometimes referred to as semiconductor devices 14, devices 14, SPAD-based image sensors 14, or image sensors 14). One or more lenses 28 may optionally cover each semiconductor device 14. During operation, lenses 28 (sometimes referred to as optics 28) may focus light onto SPAD-based semiconductor device 14. SPAD-based semiconductor device 14 may include SPAD pixels that convert the light into digital data. The SPAD-based semiconductor device may have any number of SPAD pixels (e.g., hundreds, thousands, millions, or more). In some SPAD-based semiconductor devices, each SPAD pixel may be covered by a respective color filter element and/or microlens.

The SPAD-based semiconductor device 14 may optionally include additional circuitry such as logic gates, digital counters, time-to-digital converters, bias circuitry (e.g., source follower load circuits), sample and hold circuitry, correlated double sampling (CDS) circuitry, amplifier circuitry, analog-to-digital (ADC) converter circuitry, data output circuitry, memory (e.g., buffer circuitry), address circuitry, etc.

Image data from SPAD-based semiconductor device 14 may be provided to image processing circuitry 16. Image processing circuitry 16 may be used to perform image processing functions such as automatic focusing functions, depth sensing, data formatting, adjusting white balance and exposure, implementing video image stabilization, face detection, etc. For example, during automatic focusing operations, image processing circuitry 16 may process data gathered by the SPAD pixels to determine the magnitude and direction of lens movement (e.g., movement of lens 28) needed to bring an object of interest into focus. Image processing circuitry 16 may process data gathered by the SPAD pixels to determine a depth map of the scene.

Imaging system 10 may provide a user with numerous high-level functions. In a computer or advanced cellular telephone, for example, a user may be provided with the ability to run user applications. To implement these functions, the imaging system may include input-output devices 22 such as keypads, buttons, input-output ports, joysticks, and displays. Additional storage and processing circuitry such as volatile and nonvolatile memory (e.g., random-access memory, flash memory, hard drives, solid state drives, etc.), microprocessors, microcontrollers, digital signal processors, application specific integrated circuits, and/or other processing circuits may also be included in the imaging system.

Input-output devices 22 may include output devices that work in combination with the SPAD-based semiconductor device. For example, a light-emitting component (such as a laser) may be included in the imaging system to emit light (e.g., infrared light or light of any other desired type). Semiconductor device 14 may measure the reflection of the light off of an object to measure distance to the object in a LIDAR (light detection and ranging) scheme.

Figure 6:
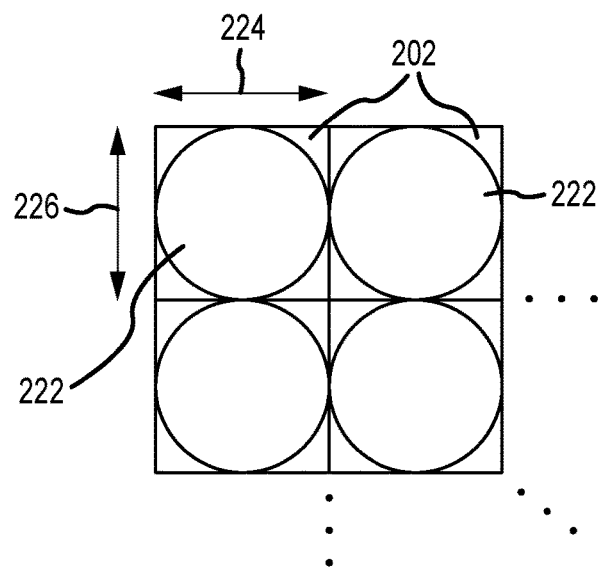
FIG. 6 is a top view of an illustrative SPAD-based semiconductor device with square microcells in accordance with an embodiment.

FIG. 6 is a top view showing an arrangement of square SPAD devices 202 (sometimes referred to as microcells 202). The microcells 202 may be part of a silicon photomultiplier. The silicon photomultiplier may optionally be part of an array of silicon photomultipliers.

Each microcell 202 may be covered by a respective microlens 222. The microlens may focus light onto the diode of microcell 202. In FIG. 6, each microcell 202 may be a square having a width 224 and a length 226. Width 224 is equal to length 226. Accordingly, microlens 222 may be circular (with a width that is also equal to its length). The example of microlens 222 being circular is merely illustrative. The microlens may have planar sides with rounded corners, other complex shapes, etc. In general, the base of the microlens will have dimensions that are approximately the same as the dimensions of the microcell.

Figure 7:
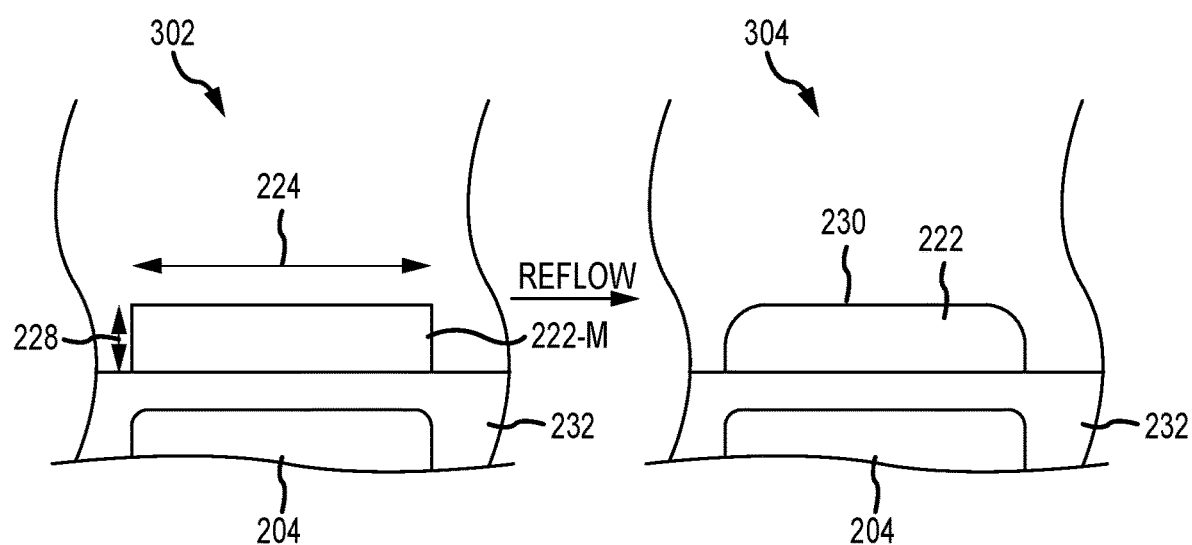
FIG. 7 is a cross-sectional side view showing an illustrative method of forming the SPAD-based semiconductor device with square microcells of FIG. 6 in accordance with an embodiment.

Microlenses 222 may be formed by patterning a layer of material onto a semiconductor substrate that includes SPADs. FIG. 7 is a cross-sectional side view showing an illustrative method of forming microlenses 222. As shown in FIG. 7, at step 302, microlens material 222-M may be formed on semiconductor substrate 232 over single-photon avalanche diode 204. Semiconductor substrate 232 may be formed from silicon or another desired semiconductor material.

Microlens material 222-M may be formed by depositing a layer of the material in a uniform thickness across the entire semiconductor substrate and then patterning the layer (e.g., using photolithography or another desired patterning technique) to have discrete portions over each SPAD 204. The microlens material may be acrylic or any other desired material.

The microlens material 222-M has a width 224 and a thickness 228. Manufacturing limitations may limit the maximum allowable thickness 228 for the microlens material. Reflow may be performed to melt the microlens material 222-M to form microlens 222 at step 304.

As the ratio of width 224 to thickness 228 of the microlens material 222-M increases, the reflow process to form a microlens with desired curvature may become less effective. For example, in the example of FIG. 7, the ratio of width 224 ($w$) to thickness 228 ($h$) may be 3 to 1. At a ratio this high, a microlens with a spherical upper surface may not be formed during reflow. As shown in step 304 in FIG. 7, the upper surface of microlens 222 has a planar portion 230 instead of a continuously curved upper surface (which may be desired for optimal lensing power).

Therefore, the microlens lensing power becomes less effective as the ratio of width to thickness (of the microlens material in step 302) increases. As previously mentioned, the thickness of the microlens material may be fixed by manufacturing limitations. This means that the width of the microlens that may be achieved with a curved upper surface is limited.

Consider an example where microlens material 222-M has a maximum thickness of 6 microns. With a fixed thickness of 6 microns, the maximum width 224 for microlens material 222-M that results in a microlens 222 with desired curvature may be 15 microns. In other words, at widths less than 15 microns the microlens may have desired curvature after reflow. At widths greater than 15 microns, meanwhile, the microlens will have a planar upper surface portion after reflow (as shown in FIG. 7). Therefore, given the square arrangement of microcells 202 in FIGS. 6 and 7, the maximum dimensions of the microcell (while having a microcell of the desired shape) may be 15 microns by 15 microns. It should be noted that the dimensions of this example are merely illustrative.

In some applications, it may be desired to have microcells that are larger than permitted by the above design constraints. For example, a square microcell with a microlens having desired curvature at its upper surface has a maximum area of 225 square microns (15 microns×15 microns). Increasing the area of the square microcell beyond this point will result in the microlens lacking the desired lensing power.

To allow for an increase in the area of the microcell while maintaining desired lens properties in the microlens, a rectangular microcell with a rectangular microlens may be used.

Figure 8:
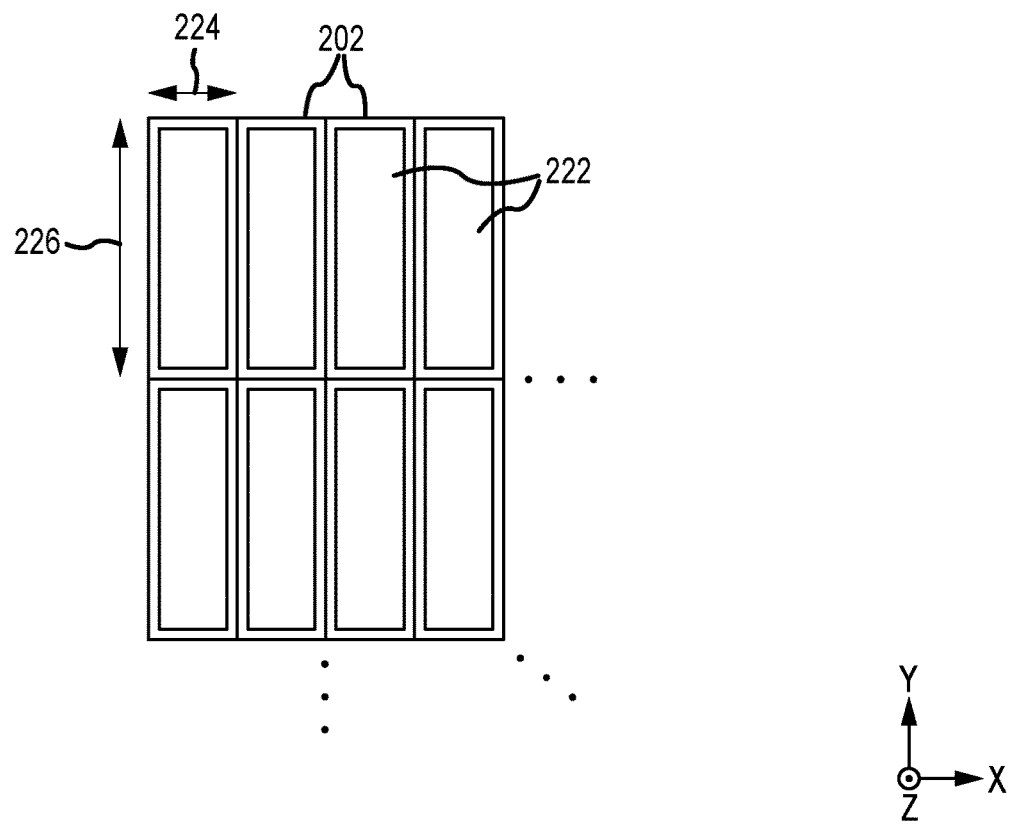
FIG. 8 is a top view of an illustrative SPAD-based semiconductor device with non-square, rectangular microcells in accordance with an embodiment.

FIG. 8 is a top view showing an arrangement of various SPAD devices 202 (sometimes referred to as microcells 202). The microcells 202 may be part of a silicon photomultiplier. The silicon photomultiplier may optionally be part of an array of silicon photomultipliers.

Each microcell 202 may be covered by a respective microlens 222. The microlens may focus light onto the diode of microcell 202. In FIG. 8, each microcell 202 may be a non-square rectangle having a width 224 and a length 226. Width 224 is less than length 226. Accordingly, microlenses 222 may also be non-square rectangular (with a width that is less than its length). A SPAD covered by microlens 222 may also be non-square rectangular (with a width that is less than its length).

The aspect ratio of each microlens 222 (and corresponding microcell 202 and SPAD 204) may be the ratio of the length (e.g., the longer dimension of the two dimensions when looking from above) to the width (e.g., the smaller dimension of the two dimensions when looking from above). The aspect ratio of microlenses 222 (and corresponding microcell 202 and SPAD 204) is greater than 1:1. The aspect ratio of microlens 222, microcell 202, and SPAD 204 may be greater than 2:1, greater than 3:1, greater than 4:1, greater than 5:1, greater than 8:1, greater than 10:1, less than 2:1, less than 3:1, less than 4:1, less than 5:1, less than 8:1, less than 10:1, between 2:1 and 10:1, between 3:1 and 8:1, between 3:1 and 10:1, between 2:1 and 8:1, or any other desired aspect ratio. The aspect ratio of the microcells, the SPADs, and the microlenses may be approximately the same (e.g., within 20%, within 10%, within 5%, within 1%, etc.).

The width of each microcell, SPAD, and microlens (e.g., width 224 in FIG. 8) may be greater than 3 microns, greater than 5 microns, greater than 8 microns, greater than 10 microns, greater than 20 microns, greater than 30 microns, greater than 50 microns, less than 5 microns, less than 8 microns, less than 10 microns, less than 20 microns, less than 30 microns, less than 50 microns, between 5 and 20 microns, between 8 and 30 microns, between 5 and 30 microns, etc. The length of each microcell, SPAD, and microlens (e.g., length 226 in FIG. 8) may be greater than 10 microns, greater than 15 microns, greater than 18 microns, greater than 20 microns, greater than 50 microns, greater than 100 microns, greater than 200 microns, greater than 220 microns, greater than 300 microns, less than 15 microns, less than 18 microns, less than 20 microns, less than 50 microns, less than 100 microns, less than 200 microns, less than 220 microns, less than 300 microns, between 15 and 200 microns, between 18 and 220 microns, between 15 and 220 microns, etc.

Figure 9:
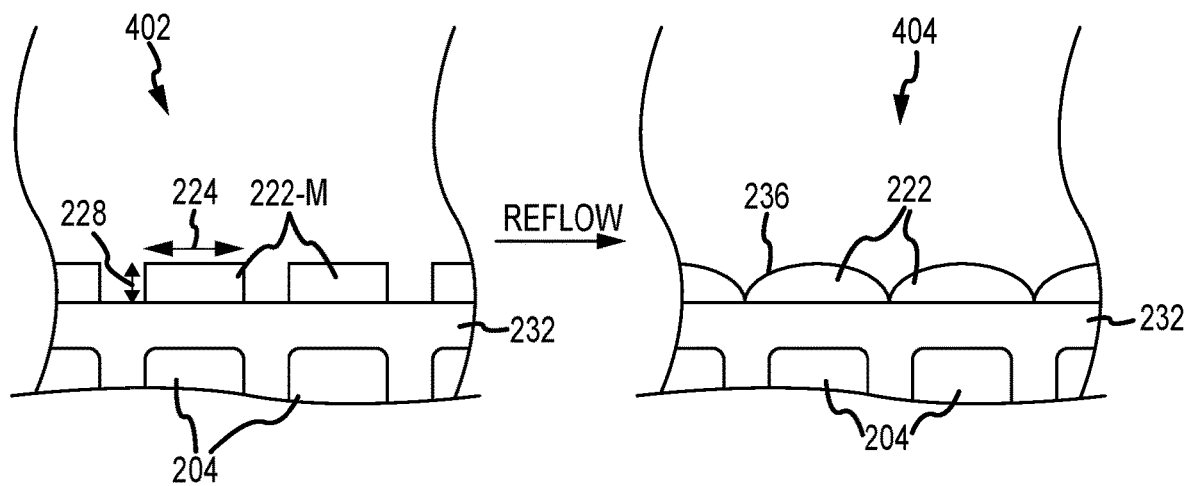
FIG. 9 is a cross-sectional side view showing an illustrative method of forming the SPAD-based semiconductor device with non-square, rectangular microcells of FIG. 8 in accordance with an embodiment.

Microlenses 222 may be formed by patterning a layer of material onto a semiconductor substrate that includes SPADs. FIG. 9 is a cross-sectional side view showing an illustrative method of forming microlenses 222. As shown in FIG. 9, at step 402, microlens material 222-M may be formed on semiconductor substrate 232 over single-photon avalanche diodes 204. A discrete portion of microlens material 222-M may be formed over each corresponding SPAD 204. Semiconductor substrate 232 may be formed from silicon or another desired semiconductor material.

Microlens material 222-M may be formed by depositing a layer of the material in a uniform thickness across the entire semiconductor substrate and then patterning the layer (e.g., using photolithography or another desired patterning technique) to have discrete portions over each SPAD 204. The microlens material may be acrylic or any other desired material.

The microlens material 222-M has a width 224 and a thickness 228. Due to the non-square, rectangular shape of the SPAD and corresponding microlens, the ratio of width 224 to thickness 228 may be reduced without sacrificing total microcell area. For example, in FIG. 9 the ratio of width 224 to thickness 228 may be 2:1. Reflow may be performed to melt the microlens material 222-M to form microlenses 222 at step 404. Due to the sufficiently low ratio of width to thickness, microlenses 222 have desired curved upper surfaces 236 after reflow.

The microlens may have curvature in the X-direction and therefore may focus light that is spread along the X-dimension. Due to the elongated rectangular shape, the microlens may have little to no curvature in the Y-direction. However, sacrificing curvature in the Y-direction in this way allows the microcell to have virtually no length limitations in the Y-direction. Therefore, the rectangular microcell may have a desired surface area while still focusing light with a curved microlens in the X-direction. The microlens may sometimes be described as having a cylindrical shape. The curvature in the X-direction may be greater than the curvature in the Y-direction (e.g., a radius of curvature in the X-direction may be smaller than a radius of curvature in the Y-direction). More than 10% or any other desired percentage (e.g., more than 5%, more than 25%, more than 50%, more than 75%, etc.) of the upper surface of the microlens may be planar in the Y-direction.

A rectangular microlens with the same total area as a square microlens will have better lensing in the short-axis (X) direction than a corresponding square microlens. Using a rectangular microcell with a rectangular microlens may also reduce the angle-of-incidence dependence in the long-axis (Y) direction.

Figure 10:
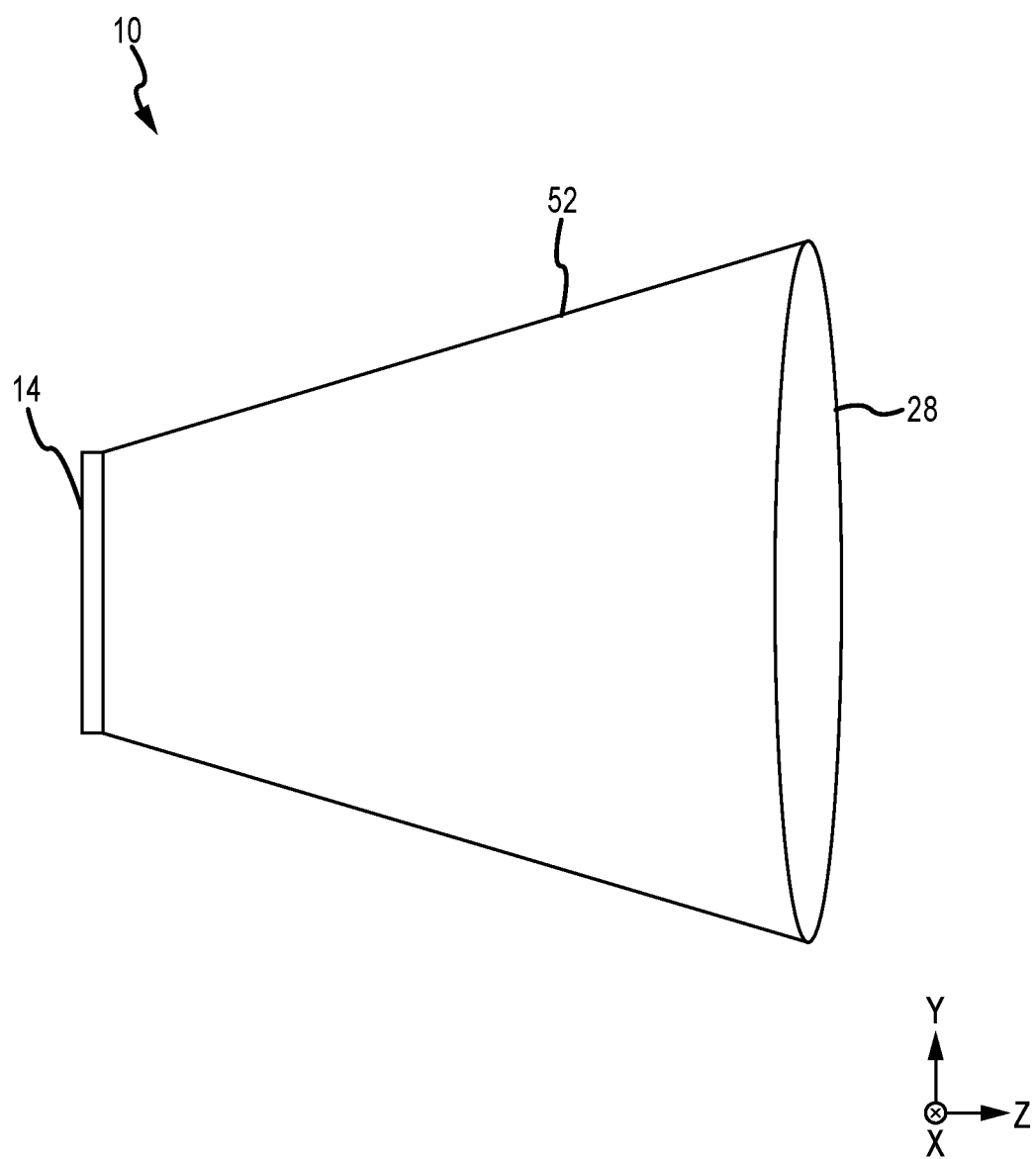
FIG. 10 is a side view showing an illustrative imaging system with a lens that focuses light onto a SPAD-based semiconductor device with non-square, rectangular microcells in accordance with an embodiment.

FIG. 10 is a cross-sectional side view of an illustrative imaging system with a lens 28 that focuses light 52 onto SPAD-based semiconductor device 14. SPAD-based semiconductor device 14 may include non-square, rectangular microcells (and non-square rectangular microlenses/SPADs) of the type shown in FIGS. 8 and 9. The microcells in FIG. 10 are elongated in the Y-direction (similar to as in FIGS. 8 and 9) and have curvature in the X-direction. Using microlenses that are elongated in the Y-direction will minimize dependence of the imaging system on the illumination angle-of-incidence in the Y-direction. Light that is incident on lens 28 may be focused on the SPAD-based semiconductor device 14 at a range of angles depending on the distance of the incident light from the center of the lens. Minimizing dependence on angle of incidence is therefore advantageous to compensate for this range in incident light angles.

Figure 11:
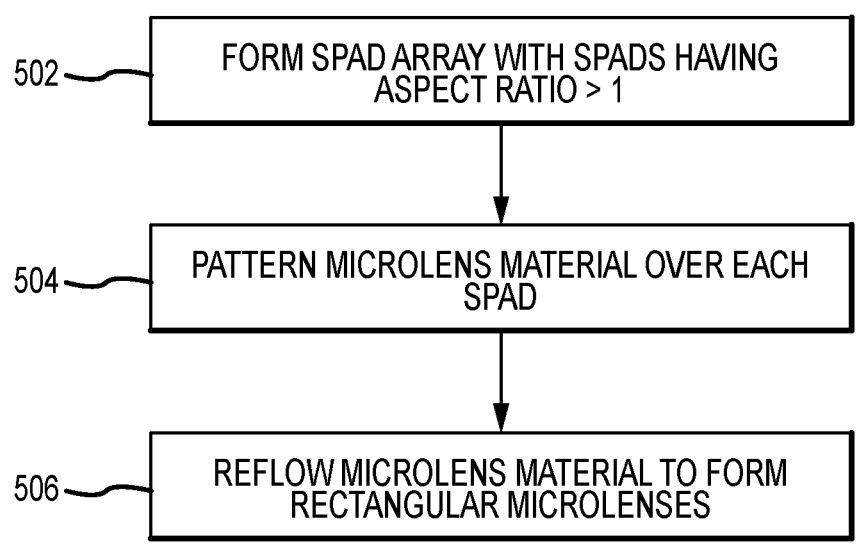
FIG. 11 is a flowchart showing illustrative method steps for forming a SPAD-based semiconductor device with non-square, rectangular microcells in accordance with an embodiment.

FIG. 11 is a flowchart showing illustrative method steps for forming a SPAD-based semiconductor device with rectangular microlenses of the type shown in FIGS. 8 and 9. At step 502, a SPAD-based semiconductor device (e.g., a SPAD array) may be formed with each SPAD (and corresponding microcell) having an aspect ratio that is greater than 1. The single-photon avalanche diodes may be formed in a semiconductor substrate.

At step 504, microlens material may be patterned over each microcell. The microlens material may be deposited by spinning a layer of material onto the semiconductor substrate (e.g., with a uniform thickness). The microlens material may then be patterned over each microcell. In one arrangement, each microcell may have a respective discrete portion of microlens material. In another arrangement, strips of microlens material may be formed over columns of microcells. Considering the example of FIGS. 8 and 9, the microlens material may be patterned in strips that extend in the Y-direction. In other words, since there is no microlens curvature in the Y-direction, the gaps between the microlens material in the Y-direction may be omitted. The example of a spin-on layer of material that is then patterned is merely illustrative. In general, any desired methods may be used to deposit and pattern the microlens material.

At step 506, the patterned microlens material may be reflowed to form microlenses having an aspect ratio that is greater than 1. The reflow operations may include heating the microlens material past its melting point such that the microlens material transitions from a solid to a liquid. Once in liquid form, curvature occurs in the microlens material (e.g., due to surface tension). After the microlens material has the desired curvature, the microlens material may be cooled to solidify the microlenses in the desired shapes. The microlenses may have curvature in one direction (e.g., along the X-dimension in FIGS. 8 and 9) and may have no curvature in a second, orthogonal direction (e.g., along the Y-dimension in FIGS. 8 and 9).

The foregoing is merely illustrative of the principles of this invention and various modifications can be made by those skilled in the art. The foregoing embodiments may be implemented individually or in any combination.

What is claimed is:

1. A semiconductor device comprising:
   an array of microcells, wherein a first microcell in the array of microcells comprises:
   a single-photon avalanche diode that has an aspect ratio that is greater than 5:1; and
   a microlens that covers the single-photon avalanche diode.

2. The semiconductor device defined in claim 1, wherein the single-photon avalanche diode has a width and a length that is longer than the width, wherein the microlens has a first dimension parallel to the width and a second dimension parallel to the length, and wherein the microlens has an upper surface that is curved along the first dimension.

3. The semiconductor device defined in claim 2, wherein the upper surface of the microlens has less curvature along the second dimension than along the first dimension.

4. The semiconductor device defined in claim 2, wherein the width is between 5 microns and 30 microns and wherein the length is between 15 microns and 220 microns.

5. The semiconductor device defined in claim 1, wherein the first microcell further comprises:
   quenching circuitry coupled to the single-photon avalanche diode.

6. The semiconductor device defined in claim 1, wherein the single-photon avalanche diode is the only single-photon avalanche diode covered by the microlens.

7. A method of forming a semiconductor device comprising:
   forming an array of non-square, rectangular single-photon avalanche diodes in a semiconductor substrate, wherein each single-photon avalanche diode has an aspect ratio that is greater than 5:1;
   patterning microlens material over the single-photon avalanche diodes; and
   reflowing the microlens material to form a plurality of non-square, rectangular microlenses, wherein each non-square, rectangular microlens covers one respective non-square, rectangular single-photon avalanche diode without covering any additional single-photon avalanche diodes.

8. The method defined in claim 7, wherein patterning the microlens material over the single-photon avalanche diodes comprises:
   depositing a layer of material over the single-photon avalanche diodes that has a uniform thickness; and
   patterning the layer of material.

9. The method defined in claim 8, wherein depositing the layer of material over the single-photon avalanche diodes comprises spinning on the layer of material.

10. The method defined in claim 7, wherein the microlens material comprises acrylic.

* * * * *